United States Patent [19]

Wile

[11] Patent Number: 4,509,204

[45] Date of Patent: Apr. 2, 1985

[54] AM RADIO STOP DETECTOR

[75] Inventor: Donald T. Wile, San Jose, Calif.

[73] Assignee: National Semiconductor Corporation, Santa Clara, Calif.

[21] Appl. No.: 535,186

[22] Filed: Sep. 23, 1983

[51] Int. Cl.³ .............................................. H03J 7/18
[52] U.S. Cl. ................................................... 455/169
[58] Field of Search ................ 455/161, 164, 165, 169

[56] References Cited

U.S. PATENT DOCUMENTS 3,714,580  1/1973  Close .................................... 455/169
4,262,363  4/1981  Wiechmann et al. ................ 455/161

FOREIGN PATENT DOCUMENTS 158529  12/1981  Japan .................................... 455/161

Primary Examiner—Jin F. Ng
Attorney, Agent, or Firm—Gail W. Woodward; Michael J. Pollock; Paul J. Winters

[57] ABSTRACT

Disclosed is a stop detector circuit for issuing a stop signal in an electronically tuned AM radio when the radio is center tuned on a radio signal that exceeds a predetermined level of signal strength. An intermediate frequency signal and an automatic gain control signal are used to determine when the stop signal is to be issued. Included in the stop detector circuit are a resonator driver (16), a resonator circuit (18), a resonator signal amplifier (20), a current switch (22), a threshold adjustment and filter (24), and a threshold detector (26). The resonator driver generates a resonator signal having a series of current pulses at the same frequency as the intermediate frequency signal. The resonator circuit converts the resonator signal current to a voltage, the AC component of which is at a minimum when the radio is not center tuned and at a maximum when the radio is center tuned. The resonator signal amplifier amplifies the resonator signal voltage. This is necessary because the resonator signal current is kept small in order to minimize tweet interference caused by feedback. The current switch generates a station strength signal in response to the resonator signal voltage and the current of the automatic gain control signal. The current of the station strength signal equals a large fraction of the current of the automatic gain control signal when the radio is center tuned. The threshold adjustment and filter provides means for filtering current pulses from the station strength signal converting the station strength signal to a DC voltage and for adjusting this voltage. When the voltage of the station strength signal exceeds a predetermined value, the threshold detector issues the stop signal. The predetermined value is exceeded only when the radio is center tuned and the automatic gain control signal is sufficiently high.

9 Claims, 5 Drawing Figures

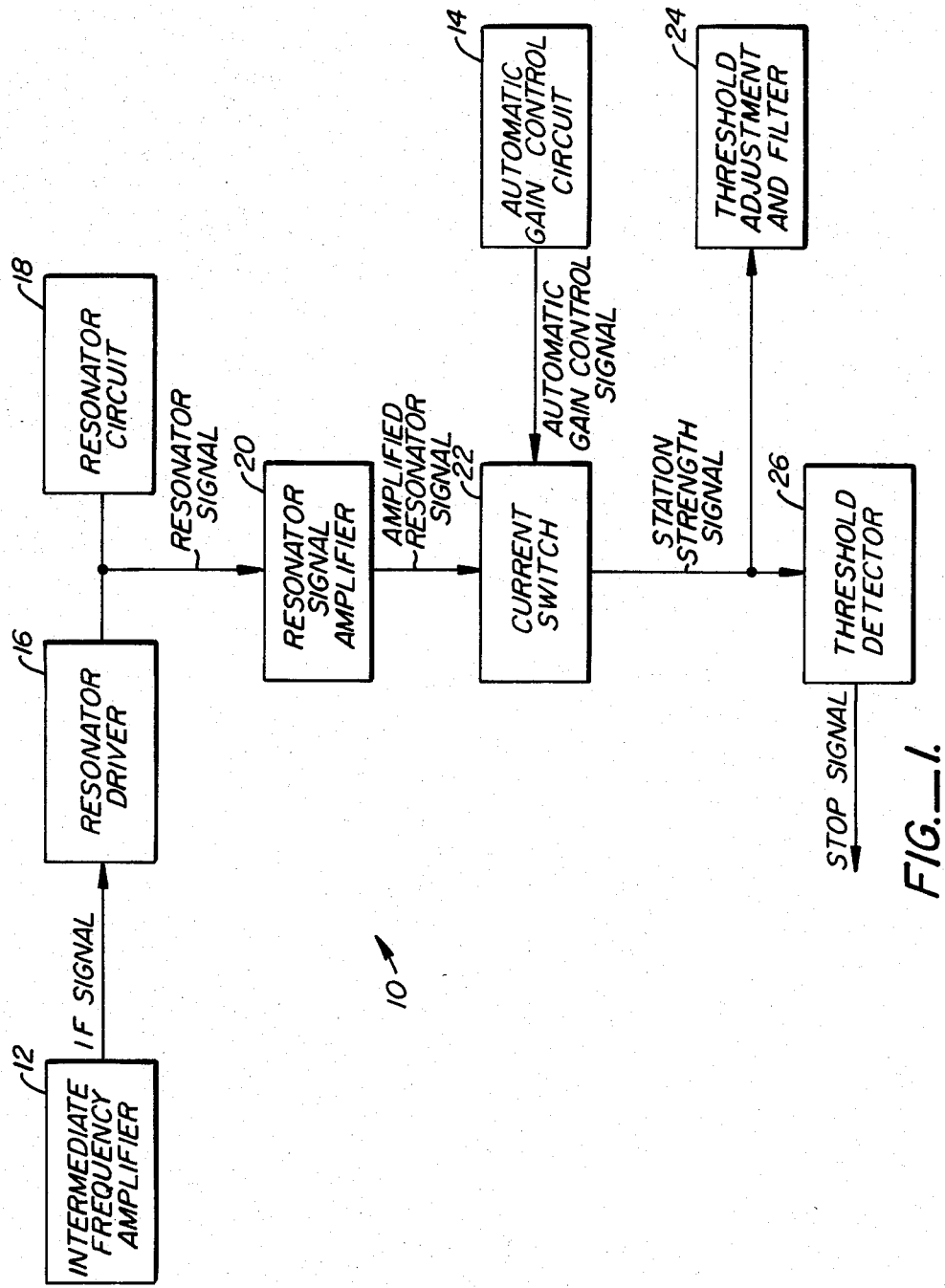
FIG._1.

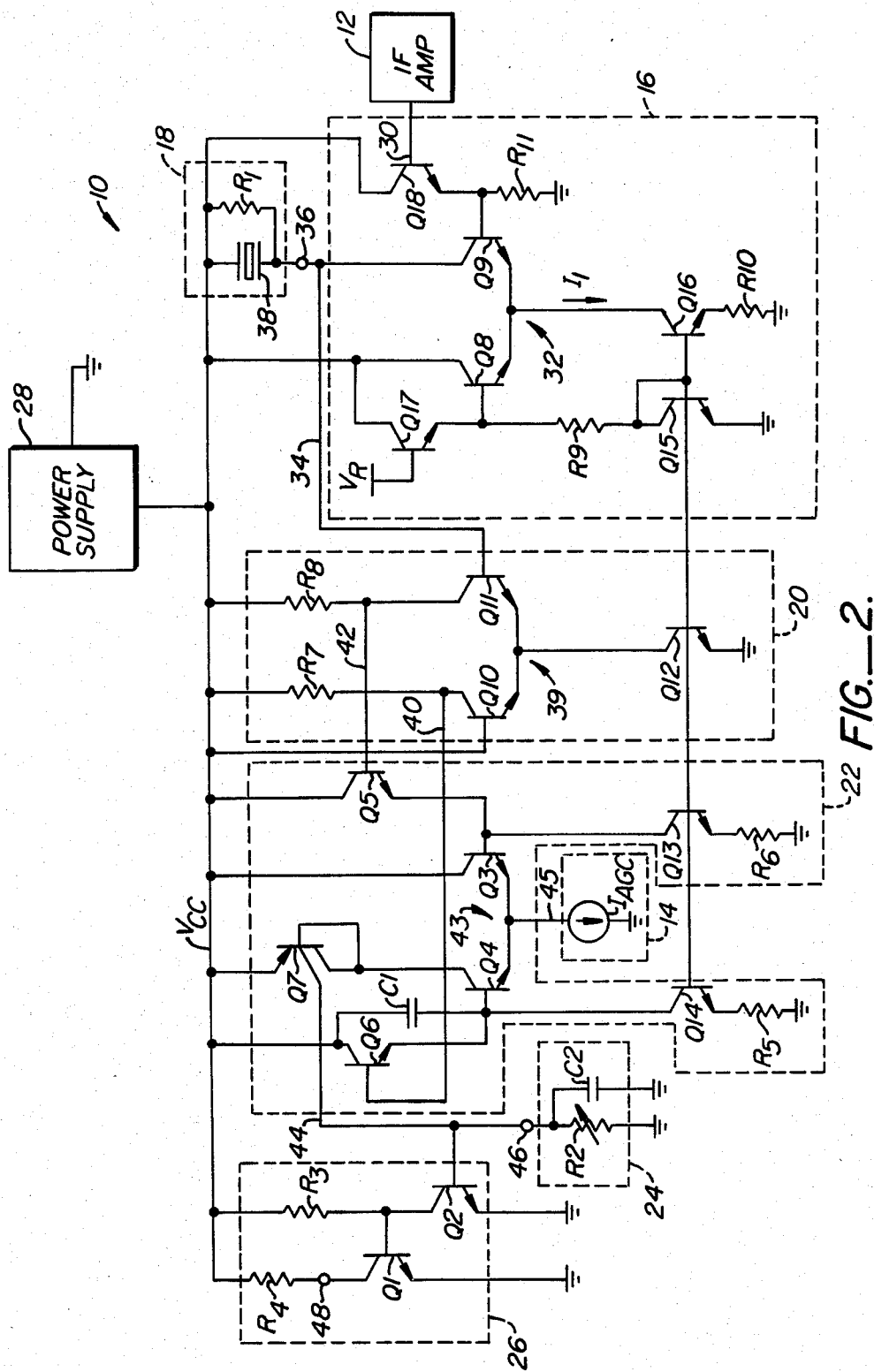
FIG._2.

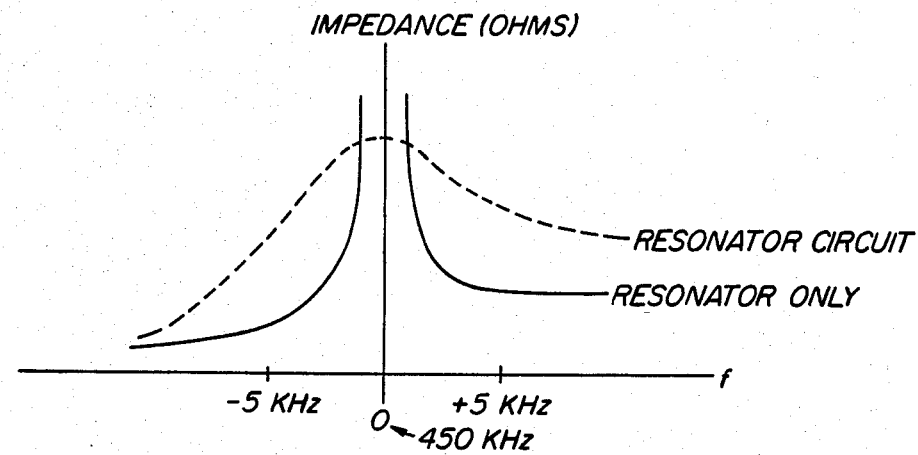
FIG._3.
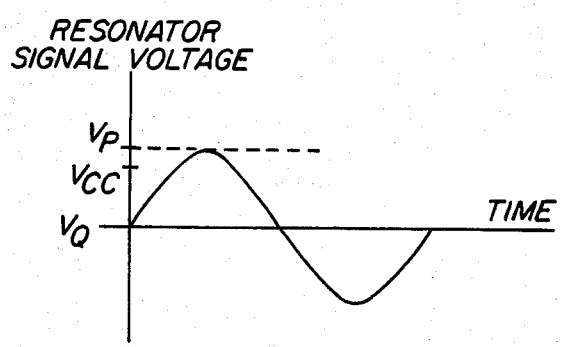
FIG._4.
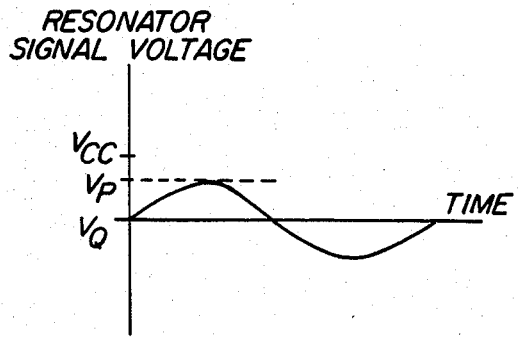
FIG._5.

AM RADIO STOP DETECTOR

BACKGROUND OF THE INVENTION

1. Field of the Invention

This invention relates generally to an apparatus and a method for tuning a radio receiver to the strongest signals of a broadcast radio spectrum, and more particularly to automatic tuning circuits in electronically tuned AM radios for selecting and automatically locking onto the strongest portion of a received AM radio signal having a signal strength above a preselected threshold level.

2. Description of the Prior Art

In conventional radio signal receivers, the output signal of the receiver radio is generally of better quality when the receiver is tuned as close as possible to the carrier or center frequency of the transmitted frequency signal, which the operator or listener desires to receive. It is well known that when an AM or FM receiver, for example, is tuned to a frequency somewhat removed from the broadcast frequency of the selected station or channel, a significant amount of undesired noise and distortion will be present in the audio output of the receiver. As the radio's receiver is tuned to frequencies closer to the broadcast frequency, the audio output becomes less noisy (i.e., the signal-to-noise ratio increases). Distortion decreases until the optimum is attained at or very near the broadcast frequency.

In manually tuned radio frequency signal receivers, the tuning mechanism may be adjusted until an audio signal is produced which is acceptable to the listener. A device such as a signal strength meter may be provided to visually aid in the manual tuning thereof. Another conventional tuning aid is a squelch muting circuit which, as its name implies, prevents the receiver from producing an audio output signal unless the strength of a received signal exceeds a predetermined level.

In the type of radio generally referred to as having a signal seeking or scanning receiver, a scanning circuit is typically provided which varies the frequency of the local oscillator either continuously or in discrete increments. A detector circuit is often used to stop the scanning operation when a signal of sufficient strength is received. Conventional detector circuits of this type are manually adjustable in order to compensate for the differences in the strength of the various received signals. Such differences in signal strength can be attributed to a number of factors, including differences in distances and orientation between the transmitting antenna and receiving antenna, as well as differences in the transmission power of different radio broadcasting stations. It is difficult to preset such a detector circuit so that it will provide optimum tuning for all signals of interest.

In prior art radios, a compromise was often made by broadening the range (e.g., lowering the threshold signal level which the radio will lock to) of the detector or squelch circuit. However, such a detector circuit permitted the scanning receiver to stop at a frequency other than the broadcast frequency of a radio signal. If, for example, an electronically tuned radio that scanned in increments of 5 KHz encountered a sufficiently strong radio signal at a receiver frequency of 605 KHz, its detector circuit would stop the receiver at 605 KHz. However, the signal at 605 KHz may have resulted from a strong radio signal broadcast at 610 KHz. In this case, the receiver would have stopped at 605 KHz before it reached the center tuned signal at 610 KHz. In other words, as the scanning receiver was tuned near a strong signal, the threshold signal level for stopping the scanning action could have been reached before the scanner was tuned to the broadcast frequency of the signal. Moreover, if the scanning receiver displayed the tuned frequency, the frequency displayed was not the broadcast frequency. Thus, it is desirable to stop at only center tuned signals, and not to stop at signals that are not center tuned.

Additional problems existed with prior art radios. First, none of the circuits provided for a tunable resonator for tuning to the broadcast frequency of the radio signal. Second, existing technology required many individual discrete electrical components to be properly selected and connected together to obtain a received signal of the quality desired. Third, signal seeking or scanning receivers have been successfully developed for FM radio broadcast signals, but AM signal seeking or scanning receivers have been of marginal quality. Fourth, prior art radio technology has failed to solve problems associated with AM radio systems, such as (1) removal of the audio component from the modulated component of the IF signal, and (2) elimination of the tweet interference. Fifth, AM radio systems have not advantageously used the amplitude characteristic of a tuned element, as FM radio systems have used the phase characteristic of a tuned element.

SUMMARY OF THE INVENTION

This invention advantageously resolves the above problems by offering a new stop detector circuit for tuning AM radios. To aid in quick comprehension of the invention, reference numerals and characters are included in parentheses in this summary of the invention. These parenthetical reference numerals correspond to the reference numerals and characters shown on the drawings and used in the preferred embodiment of the present invention that is described in the detailed description of the invention. However, these reference numerals are not to be construed as limiting the invention only to the design shown in the drawings, because the invention can and will take many different forms depending upon application of the invention. The breadth of the invention is to be construed only by the claims.

According to the preferred embodiment of the present invention, an electronic circuit (10) is disclosed for issuing a stop signal in an electronically tuned radio. The electronically tuned radio includes a receiver for scanning the AM broadcast band and for receiving broadcast signals. The receiver has a receiver frequency that is variable in discrete increments. The radio also has an intermediate frequency amplifier (12) that generates an intermediate frequency signal according to circuits well known in the art. When the receiver is tuned to the broadcast frequency of a received broadcast signal (i.e. the receiver is center tuned), the frequency of the intermediate frequency signal equals a predetermined reference frequency. This reference frequency may be, for example, 450 KHz. When the receiver is tuned to a frequency not equal to the broadcast frequency of a received broadcast signal (i.e. the receiver is not center tuned), the frequency of the intermediate frequency signal does not equal the reference frequency. The radio also includes an automatic gain control current ($I_{AGC}$) that is proportional to the strength of the received broadcast signal.

The electronic circuit of the present invention utilizes the intermediate frequency signal and the automatic gain control current to determine whether a stop signal should be generated. Included in the circuit are a resonator driver (16), a resonator circuit (18), a resonator signal amplifier (20), a current switch (22), a threshold adjustment and filter (24), and a threshold detector (26).

The resonator driver (16) generates a resonator signal current in response to the intermediate frequency signal. The resonator signal current is a series of current pulses havng the same frequency as the intermediate frequency signal.

The resonator circuit (18) has a frequency dependent impedance which converts the resonator signal current to a resonator signal voltage. The magnitude of the AC component of the resonator signal voltage is at a maximum when the frequency of the resonator signal current and the corresponding intermediate frequency signal are equal to the reference frequency (i.e. the receiver is center tuned). The magnitude of the AC component of the resonator signal voltage is a minimum when the frequency of the resonator signal current and intermediate frequency signal are not equal to the reference frequency, which occurs when the receiver frequency is not equal to the frequency of the received broadcast signal.

The resonator signal amplifier (20) amplifies the resonator signal voltage to generate an amplified resonator signal. Amplification is necessary because the resonator signal current is kept small in order to minimize tweet interference that results from resonator signal feedback to the radio antenna input through the resonator circuit.

The current switch (22) operates on the amplified resonator signal and the automatic gain control current to generate a station strength signal. The current of the station strength signal is a large fraction of the automatic gain control current when the frequency of the resonator signal current substantially equals the reference frequency (i.e. the receiver is center tuned). When the receiver is not center tuned, the current of the station strength signal is a small fraction of the automatic gain control current.

The threshold adjustment and filter (24) acts to filter out alternating current pulses in the station strength signal and to convert the station strength signal to a DC voltage. The threshold adjustment and filter also provides means for setting a threshold value.

The threshold detector (26) acts on the station strength signal and generates a stop signal when the voltage of the station strength signal exceeds the threshold value set by the threshold adjustment and filter.

A method is described for issuing a stop signal in an electronically tuned radio when the receiver frequency of the radio substantially equals the broadcast frequency of a received broadcast signal (i.e. the receiver is center tuned), and when the signal strength of the received broadcast signal is sufficiently high. The disclosed method includes the following steps:

(a) generating a resonator signal current having a series of current pulses, where the frequency of the resonator signal current equals the frequency of the intermediate frequency signal to thereby remove the effect of modulation of the intermediate frequency signal on the resonator signal current;

(b) converting the resonator signal current to a resonator signal voltage, the magnitude of the AC component of which is inversely related to the difference between the frequency of the resonator signal and a reference frequency, where the reference frequency substantially equals the frequency of the intermediate frequency signal when the receiver is center tuned;

(c) amplifying the resonator signal voltage to produce an amplified resonator signal;

(d) generating a station strength signal in response to the magnitude of the amplified resonator signal, where the station strength signal has a current equal to a large fraction of the automatic gain control current when the frequency of the resonator signal substantially equals the reference frequency;

(e) filtering the alternating current pulses from the station strength signal and converting this signal to a DC voltage; and (f) generating a stop signal when the voltage of the station strength signal exceeds a threshold value.

BRIEF DESCRIPTION OF THE DRAWINGS

The features of the present invention, which are believed to be novel, are set forth with particularity in the appended claims. The organization and manner of operation of the invention may best be understood by reference to the embodiment described in the following Detailed Description, taken in conjunction with the accompanying drawings, and in which:

FIG. 1 is a block diagram of an AM radio stop detector circuit according to the preferred embodiment of the present invention;

FIG. 2 is a schematic diagram of the AM radio stop detector circuit of FIG. 1;

FIG. 3 is a graph of the impedance of the resonator circuit and of the resonator alone at frequencies near the resonant frequency of the resonator;

FIG. 4 is a graphical representation of the the resonator signal voltage verses time at the input to the resonator signal amplifier when the frequency of the intermediate frequency signal substantially equals the resonant frequency of the resonator; and FIG. 5 is a graphical representation of the resonator signal voltage verses time when the frequency of the intermediate frequency signal does not equal the resonant frequency of the resonator.

DETAILED DESCRIPTION OF THE PREFERRED EMBODIMENT

The preferred embodiment of the present invention is a stop detector circuit for use in an electronically tuned radio. The electronically tuned radio has a receiver that is operable for scanning the range of frequencies that comprise the radio broadcast band. The receiver is also operable for receiving radio signals at a receiver frequency, where the receiver frequency is variable in discrete increments throughout the radio broadcast band. The stop detector circuit issues a stop signal to the receiver when two conditions are met. The first condition is that the receiver frequency must substantially equal the carrier frequency of a received radio signal (i.e. the receiver is center tuned), to insure that the signal strength of the received radio signal is at a maximum. The second condition is that the strength of the received radio signal must exceed a predetermined threshold value, below which the signal strength is too weak. When these two conditions are satisfied, the stop detector circuit issues the stop signal which in turn directs the receiver to stop scanning, thus locking the receiver to a strong radio signal.

The electronically tuned radio is of conventional construction and includes a mixer circuit that converts the received radio signal to an intermediate frequency signal. The frequency of the received radio signal may equal any of the several carrier frequencies within the radio broadcast band. The mixer circuit shifts the frequency of the received radio signal to generate the intermediate frequency signal. This frequency shifting is useful because it allows for the use of a fixed frequency, highly selective filter circuit which is capable of passing only a small bandwidth of signal at the IF frequency. This IF filtering is what allows for the selectivity of the AM radio.

The mixer circuit generates the intermediate frequency signal by subtracting the local oscillator signal frequency from the received radio signal frequency. The frequency of the local oscillator signal is proportional to the receiver frequency and changes as the receiver scans the radio broadcast band. When the receiver frequency is equal to the carrier frequency of the received radio signal (i.e. the receiver is center tuned), the frequency of the intermediate frequency signal is equal to a predetermined reference frequency that is centered in the bandwidth of the intermediate frequency signal.

The receiver frequency may not always equal the carrier frequency of the received radio signal. This may occur when the receiver is tuned to a receiver frequency that is one incremental step away from the carrier frequency of the radio signal. It is not desirable to lock onto such a radio signal, even if the signal strength exceeds the threshold value, because a stronger signal could be received from the same radio station by changing the receiver frequency so that it does equal the carrier frequency.

When the receiver frequency does not equal the carrier frequency, the frequency of the intermediate frequency signal does not equal the reference frequency. The intermediate frequency signal is a combination of the received radio signal and the local oscillator signal, where the frequency of the local oscillator signal is a function of the receiver frequency. When the receiver frequency equals the carrier frequency of the received radio signal, the local oscillator signal exactly compensates for the carrier frequency to yield an intermediate frequency signal at the reference frequency. If, however, the receiver frequency does not equal the carrier frequency, the local oscillator signal will either under or over compensate for the carrier frequency and the frequency of the intermediate frequency signal will not equal the reference frequency. Consequently, the frequency of the intermediate frequency signal is a measure of whether or not the receiver is center tuned. The first condition for the generation of a stop signal is satisfied when the frequency of the intermediate frequency signal equals the reference frequency. For the purposes of this discussion, it will be assumed that the reference frequency is equal to 450 KHz, which is one of several typical radio and broadcast industry standard frequencies.

Turning to FIG. 1, the stop detector circuit 10 is illustrated in a block diagram. The stop detector circuit operates on two input signals to generate the stop signal as an ouput. The first input signal is the intermediate frequency signal that is supplied by an intermediate frequency amplifier 12. As described above, the frequency of the intermediate frequency signal determines whether the first condition for the generation of the stop signal is satisfied, that of the receiver frequency equaling the carrier frequency of the received radio signal. The second input signal is a measure of the signal strength of the received radio signal and determines whether the second condition is satisfied, that of the signal strength exceeding the threshold value.

An automatic gain control signal is utilized for the second input signal to the stop detector circuit. The automatic gain control signal is generated by an automatic gain control circuit 14, in a fashion well known in the art of radios. The current of the automatic gain control signal ($I_{AGC}$) is proportional to the signal strength of the received radio signal.

Stop detector circuit 10 comprises a resonator driver 16, a resonator circuit 18, a resonator signal amplifier 20, a current switch 22, a threshold adjustment and filter 24, and a threshold detector 26. The intermediate frequency signal output by the intermediate frequency amplifier 12 is input to the resonator driver 16. The resonator driver and the resonator circuit 18 output a resonator signal voltage that is amplified by the resonator signal amplifier 20 to yield an amplified resonator signal. Current switch 22 operates on both the amplified resonator signal and the automatic gain control signal to generate a station strength signal, which is filtered by the threshold adjustment and filter 24 converted to a DC voltage and fed into the threshold detector 26. If the station strength signal exceeds a predetermined value, the threshold detector issues the stop signal which directs the receiver to stop scanning.

Resonator driver 16 generates the resonator signal current in response to the intermediate frequency signal. The resonator signal current is a series of current pulses having the same frequency as the intermediate frequency signal. The voltage of the resonator signal is determined by the resonator circuit 18, which converts the resonator signal current to a voltage the magnitude of the AC component of which depends upon the frequency of the resonator signal current. When the resonator signal current and the corresponding intermediate frequency signal have a frequency equal to the reference frequency, the magnitude of the AC component of the resonator signal voltage is at a maximum. This occurs when the receiver frequency substantially equals the carrier frequency of the received radio signal (i.e. the receiver is center tuned). When the resonator signal current and the intermediate frequency signal have a frequency not equal to the reference frequency, the magnitude of the AC component of the resonator signal voltage is reduced. The latter situation occurs when the receiver frequency does not equal the carrier frequency of the received radio signal (i.e. the receiver is not center tuned) and thus indicates that a stop signal is not to be generated. The reference frequency is substantially equal to the center frequency of the bandwidth of the intermediate frequency amplifier.

It is desirable to minimize the magnitude of the resonator signal current so as to minimize tweet interference caused by feedback of the resonator signal into the radio. Accordingly, amplification of the resonator signal voltage by the resonator signal amplifier 20 is necessary to amplify the resonator signal voltage to a level sufficient to operate the current switch 22. The resonator signal amplifier receives the resonator signal voltage as an input and generates the amplified resonator signal as an output.

Current switch 22 generates the station strength signal in response to the amplified resonator signal and the automatic gain control signal. When the amplitude of the amplified resonator signal is at a maximum, which happens when the receiver frequency substantially equals the carrier frequency of the received radio signal, the current of the station strength signal is equal to a large fraction of the current of the automatic gain control signal. When the amplitude of the resonator signal is reduced, which happens when the receiver frequency does not equal the carrier frequency of the received radio signal, the current of the station strength signal is equal to a small fraction of the current of the automatic gain control signal. The current of the station strength signal is, thus, a function of the current of the automatic gain control signal and the tuning of the radio.

Threshold adjustment and filter 24 performs three tasks: it converts the station strength signal to a voltage, it filters the station strength signal voltage to a DC voltage, and it provides a means to adjust the voltage of the station strength signal. The voltage drop to ground through a resistor in the threshold adjustment and filter determines the voltage of the station strength signal. The voltage drop through the resistor is proportional to the current of the station strength signal, and, therefore, the voltage of the station strength signal at the threshold adjustment and filter is proportional to the current of the automatic gain control signal. By adjusting the value of the resistor, the voltage of the station strength signal for a given current can be adjusted.

Threshold detector 26 generates the stop signal when the voltage of the station strength signal exceeds a threshold value. If the amplitude of the resonator signal is at the maximum, and if the current of the automatic gain control signal is sufficiently high, then the voltage of the station strength signal will be sufficiently high to cause the threshold detector to issue the stop signal. If either the amplitude of the resonator signal is not at the maximum, which occurs when the receiver frequency does not equal the carrier frequency of the received radio signal, or the current of the automatic gain control signal is not sufficiently high, which occurs when the received radio signal is weak, then the threshold detector does not issue the stop signal.

The stop detector circuit 10, according to the preferred embodiment of the present invention, is illustrated in schematic detail in FIG. 2. The electronic components and interconnections therebetween that form the stop detector circuit will first be described, followed by an explanation of the operation of the circuit. A power supply 28 supplies a voltage, $V_{cc}$, to various components of the stop detector circuit. Each of the several elements of the stop detector circuit, shown in block diagram form in FIG. 1, are indicated in FIG. 2 in dashed lines.

The resonator driver 16 generates current pulses at the same frequency as the intermediate frequency signal. The intermediate frequency signal is input to the resonator driver through line 30 from the intermediate frequency amplifier 12, and is applied to the base of transistor Q18. $V_{cc}$ is applied to the collector of transistor Q18. The emitter of transistor Q18 is connected to the base of transistor Q9 and is also connected through resistor R11 to ground.

Transistors Q8 and Q9 have their emitters joined in common to form a first differential amplifier 32. The collector of transistor Q8 is connected to $V_{cc}$, while the collector of transistor Q9 is connected to the resonator circuit 18 and the resonator signal amplifier 20 through line 34. Line 34 contains the resonator signal voltage. A constant current, noted as $i_1$, is drawn through the common emitters of differential amplifier 32 by transistor Q16.

The base of transistor Q8 is held at a constant voltage by transistor Q17. Transistor Q17 has its collector connected to $V_{cc}$ and its emitter connected to the base of transistor Q8. A reference voltage $V_R$ is applied to the base of transistor Q17; this reference voltage is equal to the DC component of the signal at the base of Q18. Transistor Q17 is wired in an emitter follower configuration, with the voltage of its emitter being used to bias transistor Q8. Transistor Q17 applies a voltage to the base of Q8 that equals $V_R$ minus a diode drop.

Two transistors Q15 and Q16 form a diode-transistor current mirror that is used to establish a constant current through differential amplifier 32. The collector of transistor Q16 is coupled to the common emitter connection of Q8 and Q9. The emitter of Q16 is connected to ground through a resistor R10. One end of a resistor R9 is connected to the common connection between the emitter of transistor Q17 and the base of transistor Q8. The other end of resistor R9 is connected to the collector of transistor Q15. The collector of transistor Q15 is connected to the bases of Q15 and Q16, while the emitter of Q15 is connected to ground. Wired in this manner, transistor Q15 is equivalent to a diode between resistor R9 and ground. The magnitude of the current through the collector of Q16, $I_1$, is determined by the value of resistor R10 and the magnitude of the current through the collector of Q15. Current $i_1$ is equal to the sum of the currents through the emitters of Q8 and Q9.

The current that flows through the collector of transistor Q9 is provided by the resistor circuit. In the preferred embodiment of the present invention, the majority of components of the stop detector circuit 10 are physically located on an integrated circuit chip, while certain non-integratable or adjustable components are located off-chip and are connected to the on-chip circuitry through pin connections. The resonator circuit is one portion of the stop detector circuit that is located off-chip, and connects to line 34 through a pin connection 36. Resonator circuit 18 comprises a resonator 38 and a resistor R1 wired in parallel between the power supply 28 and pin connection 36. The parallel resonant frequency of resonator 37 is equal to the reference frequency, which in the preferred embodiment equals 450 KHz.

The resonator signal voltage that exists in line 34 is amplified by the resonator signal amplifier 20. The resonator signal amplifier is a second differential amplifier 39 formed by transistors Q10, Q11, and Q12, and resistors R7 and R8. The collectors of transistors Q10 and Q11 are connected to $V_{cc}$ through resistors R7 and R8, respectively. $V_{cc}$ is applied to the base of transistor Q10, while the resonator signal is applied to the base of transistor Q11. The emitters of transistors Q10 and Q11 are connected in common and are also connected to the collector of transistor Q12. The emitter of transistor Q12 is connected to ground, while the base of Q12 is connected to the common connection between the base and collector of transistor Q15. Transistors Q5 and Q12 form a diode-transistor current mirror that is used to establish a constant total current through the emitters of Q10 and Q11. The magnitude of the current through the collector of transistor Q12 is determined by the value of resistor R9. The amplified resonator signal is output from the resonator signal amplifier in lines 40 and 42.

which are respectively connected to the collectors of transistors Q10 and Q11.

The current switch 22 accepts the amplified resonator signal and the automatic gain control signal as inputs and generates the station strength signal as an output. Line 40 is connected to the base of transistor Q6, while line 42 is connected to the base of transistor Q5. Transistors Q5 and Q6 are wired as emitter followers to drive a third differential amplifier 43 formed by transistors Q3 and Q4. $V_{cc}$ is applied to the collectors of transistors Q5 and Q6. The emitter of transistor Q5 is connected to both the base of transistor Q3 and the collector of transistor Q13. Transistor Q13 has its base connected to the collector and base of transistor Q15 and has its emitter connected to ground through resistor R6. Transistors Q15 and Q13 form a diode-transistor current mirror that is used to draw a constant current through the emitter of transistor Q5, with the magnitude of the current determined by the value of resistor R6.

A capacitor, C1, is connected across the collector and emitter of transistor Q6 for dampening the switching action of the third differential amplifier 43. The emitter of transistor Q6 is also connected to the base of transistor Q4 and to the collector of transistor Q14. Transistor Q14 has its base connected to the collector and base of transistor Q15 and has its emitter connected to ground through resistor R5. Transistors Q15 and Q14 form a diode-transistor current mirror that is used to draw a constant current from the common connection of the emitter of transistor Q6 and capacitor C1. The resistance of resistors R5 and R6 are equal so that the currents through transistors Q14 and Q13 are also equal.

Differential amplifier 43 switches a portion of the current of the automatic gain control signal through transistor Q4 to establish the station strength signal. The emitters of transistors Q3 and Q4 are connected in common and are also connected to the automatic gain control circuit 14 through line 45. A current, equal to $I_{AGC}$, is drawn through the emitters of Q3 and Q4 by the automatic gain control circuit. The collector of transistor Q3 is connected to $V_{cc}$, the power supply voltage. The collector of transistor Q4 is connected to both the base and one collector of transistor Q7. Transistor Q7 is a PNP split collector transistor having two collectors with equal currents. The emitter of transistor Q7 is connected to $V_{cc}$ and the other collector of Q7 is connected to line 44. Line 44 carries the station strength signal having a current that equals the current through the collector of transistor Q4.

The threshold adjustment and filter 24 is preferably located off-chip and is connected to line 44 through pin connection 46. The threshold adjustment and filter comprises a resistor R2 and a capacitor C2 connected in parallel between pin connection 46 and ground. Resistor R2 provides a leakage path to ground for the station strength signal current, while capacitor C2 provides filtering of current pulses. Resistor R2 may advantageously be a variable resistor to provide means for adjusting the threshold value of the station strength signal that results in the generation of the stop signal. Alternatively, the value of resistor R2 may be chosen as a fixed value to provide a fixed threshold value.

Means for issuing the stop signal are provided by the threshold detector 26 which comprises transistors Q1 and Q2 and resistors R3 and R4. Line 44 is connected to the base of transistor Q2 and provides means for inputting the station strength signal to the threshold detector. The collector of transistor Q2 is connected to the base of transistor Q1 and through resistor R3 to $V_{cc}$. Resistor R4 is located off-chip and connects between $V_{cc}$ and pin connection 48. On-chip, the collector of transistor Q1 is connected to pin connection 48, while the emitters of both Q1 and Q2 are connected to ground. The stop signal is available at pin connection 48 and is valid when pin connection 48 is at a logic high voltage.

Having thus described the electronic components and interconnections therebetween that form the stop detector circuit 10, the operation of the stop detector circuit will now be described.

Transistor Q18 is wired in an emitter follower configuration that acts as a buffer for the intermediate frequency signal. The emitter voltage of transistor Q18 follows the voltage of the intermediate frequency signal and, in effect, transfers the intermediate frequency signal to the base of transistor Q9.

Differential amplifier 32 generates the resonator signal on line 34 at a frequency equal to the frequency of the intermediate frequency signal. The differential amplifier amplifies the difference between the signals applied to the bases of transistors Q8 and Q9. The voltage amplitude of the signal applied to the base of transistor Q9 is on the order of 1.5 volts RMS, which is sufficiently large to alternately switch transistors Q8 and Q9 on and off. The constant voltage signal applied to the base of transistor Q8 is approximately equal to the average voltage of the buffered intermediate frequency signal applied to the base of transistor Q9. The fundamental frequency (first harmonic) of the intermediate frequency signal determines the switching frequency of transistors Q8 and Q9 and the frequency of the pulses of current that comprise the resonator signal current. The resultant resonator signal current at the collector of transistor Q9 is, thus, a square wave of current pulses having a fundamental frequency equal to the fundamental frequency of the intermediate frequency signal. The switching action of differential amplifier 32 serves to remove the audio modulation that exists in the intermediate frequency signal from the resultant resonator signal current.

The voltage amplitude of the resonator signal voltage determines the fraction of the automatic gain control current ($I_{AGC}$) that is switched by the current switch 22 into the station strength signal. As described above, the magnitude of the current of each current pulse in the resonator signal current equals the current flowing through the collector of transistor Q16 ($I_1$). The magnitude of $I_1$ is a function of the current that flows through the collector of transistor Q15 and is determined by the values of resistors R10 and R9. The voltage of the resonator signal is determined by the impedance of the resonator circuit.

Resonator circuit 18 has a frequency dependent impedance, as illustated by FIG. 3. The resonator circuit comprises resonator 38 and resistor R1 connected in parallel. The impedance of the resonator alone is essentially infinite at the resonant frequency of the resonator and drops off asymptotically at frequencies away from the resonant frequency. Since the resonator circuit is formed by the resonator connected in parallel with the resistor, the resonator behaves at the resonant frequency like an extremely large resistor wired in parallel with resistor R1. Consequently, the impedance of the resonator circuit at the resonant frequency is due to the impedance of resistor R1 alone. At frequencies away from the resonant frequency, the lowered impedance of the resonator in parallel with the fixed impedance of resistor R1 lowers the net impedance of the resonator circuit. By choosing a resonator with a resonant frequency substantially equal to the reference frequency, the impedance of the resonator circuit has a maximum value at the reference frequency. As illustrated, the resonator has a resonant frequency equal to 450 KHz.

One advantageous feature of the present invention is its insensitivity to variations of the resonant frequency within standard production tolerances. In practice, it is difficult to obtain a resonator having a resonant frequency that precisely equals the center frequency of the intermediate frequency amplifier bandwidth. By wiring a resistor in parallel with a resonator, an impedance function is obtained that is relative insensitive to frequency changes at frequencies near the reference frequency. Due to this insensitivity, resonators with standard tolerances of ±1 KHz may be used.

FIG. 4 graphically illustrates the resonator signal voltage when the receiver frequency is equal to the carrier frequency of the received radio signal. For this circumstance the frequency of the resonator signal voltage equals the resonant frequency of the resonator, therefore, resistor R1 will dominate the combined parallel impedance of the resonator and R1. The resonator circuit passes the harmonics in the current pulses of the resonator signal to AC ground, leaving a sinusoidal waveform. FIG. 4 illustrates that the waveform of the resonator signal voltage is centered about a DC quiescent voltage of $V_Q$ and has a peak voltage of $V_P$. Since the average current of the resonator signal current is equal to $0.5 \times I_1$, $V_Q = V_{cc} - 0.5 \times I_1 \times R_1$, and $V_P = V_{cc} - 0.5 \times I_1 \times R_1 + 0.625 \times I_1 \times R_{RC}$, where $R_{RC}$ is the impedance of the resonator circuit and $R_1$ is the impedance of resistor R1. When the frequency of the resonator signal current equals the resonant frequency, $R_{RC} = R_1$, thus $V_P \times V_{cc} + 0.125 \times I_1 \times R_1$. As shown in FIG. 4, the peak voltage of the resonator signal voltage exceeds $V_{cc}$ in this case.

The resonator signal amplifier 20 amplifies the resonator signal voltage to a level sufficient to operate the third differential amplifier 43 in the current switch 22. The second differential amplifier 39 amplifies the difference between the resonator signal voltage on line 34, that is applied to the base of transistor Q11, and $V_{cc}$, that is applied to the base of transistor Q10. When the voltage of the resonator signal rises to within approximately 70 millivolts of $V_{cc}$, transistor Q11 turns on and begins to conduct current. This lowers the voltage of the base of transistor Q5 and raises the voltage on the base of transistor Q6. This in turn raises the voltage at the base of transistor Q4 and lowers the voltage at the base of transistor Q3, causing Q4 to conduct more of the automatic gain control current, $I_{AGC}$. Capacitor C1 acts to dampen the switching of transistor Q4 so that the current through the collector of Q4 is fairly constant and equal to a large fraction of $I_{AGC}$. Since transistor Q7 is a split collector transistor wired as a current mirror, the current output to line 44 is equal to the current through the collector of transistor Q4.

As just described, the stop detector circuit generates a station strength signal on line 44 with a current equal to a large fraction of $I_{AGC}$ when the resonator signal current is at the resonant frequency of resonator 38. However, the voltage, not the current, of the station strength signal determines when the stop signal is generated by the threshold detector 26. The voltage of the station strength signal as a function of its current is determined by the value of resistor R2. Capacitor C2 filters any remaining current pulses from the station strength signal insuring that it is a DC voltage. The steady state current of the station strength signal passes through resistor R2 to ground. This establishes a voltage at the base of transistor Q2 that is proportional to $I_{AGC}$ and to the resistance of resistor R2. When the voltage of the station strength signal exceeds approximately 0.7 volts, the emitter-base junction of transistor Q2 becomes forward biased, turning Q2 on. When transistor Q2 is on, the current flowing through the collector of Q2 lowers the voltage applied to the base of transistor Q1, turning Q1 off. This in turn raises the voltage at pin connection 48 to a logic high level, thus generating a stop signal that indicates a valid stop condition.

It is to be noted that for the voltage at the base of transistor Q2 to exceed 0.7 volts, the current $I_{AGC}$ generated by the received radio signal must be sufficiently large. Adjusting the resistance of variable resistor R2, or selecting different resistances for R2 if a fixed resistor is used, changes the minimum level of current $I_{AGC}$ that is necessary for the voltage at the base of transistor Q2 to exceed 0.7 volts. For example, selection of a small resistance for R2 means that it will take a stronger radio signal to generate a current $I_{AGC}$ of sufficient strength to generate a stop signal. Such a small resistance for R2 reduces the sensitivity of the stop detector circuit 10. Conversely, a large resistance for R2 increases the sensitivity of the stop detector circuit.

The other case of interest occurs when the receiver frequency does not equal the carrier frequency of the received radio signal (i.e. the receiver is not center tuned). Accordingly, a stop signal is not issued by the threshold detector 26. In this case, the frequency of the resonator signal current does not equal the resonant frequency of the resonator, and $R_{RC}$ is less than $R_1$. Consequently, the magnitude of the AC component of the resonator signal voltage is less than in the previous case. The peak voltage, $V_P$, is less than the power supply voltage $V_{cc}$, as shown in FIG. 5.

When the resonator signal is attenuated as shown in FIG. 5, the current switch 22 generates a weak station strength signal. Assuming that the peak voltage, $V_P$, is at least 70 millivolts less than $V_{cc}$, then transistor Q11 of the resonator signal amplifier 20 is always off. When transistor Q11 is off, the base of transistor Q5 is at a higher voltage than the base of transistor Q6. This causes the voltage at the base of transistor Q4 to be less than the voltage at the base of transistor Q3, which in turn causes Q4 to conduct only a small fraction of $I_{AGC}$ through its collector. Consequently, the current of the station strength signal is small. When the current of the station strength signal is small, the voltage is also correspondingly small, as determined by the resistance of resistor R2. Since only a small fraction of $I_{AGC}$ is present in the station strength signal, the corresponding voltage of the station strength signal is insufficient to turn transistor Q2 on. When transistor Q2 is off, transistor Q1 is on and the voltage at pin connection 48 is at a logic low level. Therefore, a stop signal is not generated when the receiver frequency does not equal the carrier frequency of the received radio signal. In other words, the stop signal is not generated when the received radio signal is not center tuned.

The value of resistor R1 sets the sensitivity of the stop detector circuit 10 in rejecting radio signals that are not center tuned. The peak voltage of the resonant signal as well as the quiescent voltage, $V_Q$, is a function of the resistance of resistor R1. Decreasing the resistance of R1 has the effect of decreasing the frequency dependence of the resonator voltage on the frequency of the resonator current drive, thus decreasing the sensitivity of the stop detector circuit in rejecting radio signals that are not center tuned. Increasing the resistance of R1 has the opposite effect.

It is to be noted that the stop detector circuit 10 of the present invention has been fabricated and is part of an AM radio integrated circuit manufactured by National Semiconductor of Sunnyvale, Calif. The designation for this system is entitled, "LM1863 AM Radio System for Electronically Tuned Radios"; the radio specification has the same title and is hereby incorporated by reference into this patent application.

The foregoing was given by way of illustration and example only. It is to be understood that the present invention is subject to various modification, without departing from its inventive nature. For example, an equivalent stop detector circuit could be constructed with PNP transistors, rather than with NPN transistors as illustrated. Therefore, the scope of the invention is defined by the breadth of the appended claims.

What is claimed is:

1. An electronic circuit for use in an electronically tuned radio for issuing a stop signal, which radio includes receiver means for scanning the AM broadcast band and receiving broadcast signals at a receiver frequency, which receiver frequency is variable in discrete increments, which radio also includes intermediate frequency means for generating an intermediate frequency signal affected by modulation and having a frequency equal to a reference frequency when said receiver frequency substantially equals the broadcast frequency of a received broadcast signal and for generating said intermediate frequency signal having a frequency other than said reference frequency when said receiver frequency does not substantially equal the broadcast frequency of the received broadcast signal, which radio also includes an automatic gain control current having a magnitude that is proportional to the strength of the received broadcast signal, said circuit comprising:
   (a) resonator drive means coupled to said intermediate frequency means for generating an oscillatory resonator signal current having a frequency equal to that of said intermediate frequency signal, and for removing effects of modulation on said IF signal;
   (b) resonator circuit means coupled to said resonator drive means for converting said resonator signal current to a resonator signal voltage where the magnitude of the AC component of said voltage is inversely related to the difference between the frequency of said resonator signal current and said reference frequency;
   (c) amplifier means coupled to said resonator drive means and said resonator circuit means for amplifying said resonator signal voltage;
   (d) current switch means coupled to said amplifier means and to said automatic gain control current for generating a station strength signal, said station strength signal having a current that is equal to a large fraction of said automatic gain control current when the frequency of said resonator signal voltage substantially equals said reference frequency;
   (e) threshold ajustment and filter means coupled to said current switch means for filtering alternating current pulses from said station strength signal, for converting said station strength signal to a DC voltage, and for setting a threshold value; and
   (f) threshold detector means coupled to said current switch means and said threshold adjustment and filter means for generating a stop signal when the voltage of said station strength signal exceeds said threshold value.

2. The circuit according to claim 1 wherein said resonator drive means comprises:
   first and second transistors connected at the emitters thereof to form a differential amplifier, said intermediate frequency signal being applied to the base of said first transistor and a reference voltage being applied to the base of said second transistor, said reference voltage being substantially equal to the average voltage of said intermediate frequency signal; and
   constant current means coupled to both of said emitters of said first and second transistors.

3. The circuit according to claim 1 wherein said resonator signal current is an oscillatory wave of current pulses at a frequency equal to the frequency of said intermediate frequency signal, and wherein said resonator circuit means comprises:
   a resonator having a parallel resonant frequency substantially equal to said reference frequency; and
   a resistor connected in parallel to said resistor to form a resonant circuit having an impedance with a maximum value at said reference frequency; and
   wherein said resonator signal is applied across said resonator and said resistor such that the resulting AC voltage swing of said resonator signal voltage is a maximum when the frequency of said resonator signal substantially equals said reference frequency and a minimum when the frequency of said resonator signal does not substantially equal said reference frequency.

4. The circuit according to claim 1 wherein said amplifier means comprises:
   first and second transistors connected at the emitters thereof to form a differential amplifier, said resonator signal being applied to the base of said first transistor and a constant voltage being applied to the base of said second transistor; and
   constant current means coupled to the emitters of said first and second transistors, whereby said amplified resonator signal is output across the collectors of said first and second transistors.

5. The circuit according to claim 4 wherein said current switch means comprises:
   a third transistor having a base thereof coupled to the collector of said first transistor;
   a fourth transistor having a base thereof coupled to the collector of said second transistor;
   a capacitor connected across the collector and emitter of said fourth transistor for filtering the output of said fourth transistor;
   a fifth transistor having a base thereof coupled to the emitter of said third transistor and having an emitter thereof coupled to said automatic gain control current;
   an sixth transistor having a base thereof coupled to the common connection of the emitter of said fourth transistor and said capacitor and having an emitter thereof coupled to the emitter of said fifth transistor and to said automatic gain control current; and a seventh transistor having a split collector, a first of said split collectors being coupled to the base of said seventh transistor and to the collector of said sixth transistor and a second of said split collectors being operable for outputting said station strength signal having a current equal to the current in said first of said split collectors.

6. The circuit according to claim 1 wherein said threshold adjustment and filter means comprises:
   a capacitor coupled between said station strength signal and ground; and
   a resistor connected in parallel to said capacitor; and wherein said threshold value is set by the value of said resistor.

7. The circuit according to claim 1 wherein said threshold detector means comprises:
   a first transistor having a base thereof coupled to receive said station strength signal from said threshold adjustment and filter means and having a voltage applied across the emitter and collector thereof; and
   wherein said stop signal is output by said threshold detector means when the voltage of said station strength signal is sufficiently high to cause said first transistor to conduct current through its emitter and collector.

8. The circuit according to claim 7 wherein said threshold detector means further comprises a second transistor, having a voltage applied across the emitter and collector thereof and having a base thereof coupled to the collector of said first transistor, for generating said stop signal at a logic high voltage when said receiver frequency equals said broadcast frequency and when the strength of said broadcast signal is above said threshold value.

9. A method for issuing a stop signal in an electronically tuned radio, wherein said radio includes receiver means for scanning the AM broadcast band and for receiving broadcast signals at a receiver frequency, said receiver frequency being variable in discrete increments, said radio also includes intermediate frequency means for generating an intermediate frequency signal having a frequency equal to a reference frequency when said receiver frequency substantially equals the broadcast frequency of a received broadcast signal and for generating said intermediate frequency signal having a frequency other than said reference frequency when said receiver frequency does not substantially equal the broadcast frequency of the received broadcast signal, said radio also includes an automatic gain control current having a magnitude that is proportional to the strength of the received broadcast signal, said method comprising:

(a) generating a resonator signal current having a frequency that equals the frequency of said intermediate frequency signal;

(b) converting said resonator signal current to a resonator signal voltage, the magnitude of the AC component of said signal voltage being inversely related to the difference between the frequency of said resonator signal current and said reference frequency;

(c) amplifying said resonator signal voltage to produce an amplified resonator signal;

(d) generating a station strength signal in response to the magnitude of said amplified resonator signal, said station strength signal having a current that is equal to a large fraction of said automatic gain control current when the frequency of said resonator signal substantially equals said reference frequency, and which is equal to a small fraction when said resonator signal does not substantially equal said reference frequency;

(e) filtering alternating current pulses from said station strength signal and converting said station strength signal to a DC voltage and for setting a theshold value; and (f) generating a stop signal when the voltage of said station strength signal exceeds said threshold value.

* * * * *